(12) United States Patent
Hsu

(10) Patent No.: US 7,248,468 B1
(45) Date of Patent: Jul. 24, 2007

(54) ANTI-SHOCK STRUCTURE FOR DATA STORAGE DEVICE

(75) Inventor: Yung-Chin Hsu, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/377,877

(22) Filed: Mar. 15, 2006

(51) Int. Cl.
*G06F 1/16* (2006.01)

(52) U.S. Cl. ............... 361/685; 174/52.1; 439/638

(58) Field of Classification Search .......... 360/97.01; 174/52.1, 50–52; 439/638; 361/752, 796, 361/728–730, 679–687, 724–727
See application file for complete search history.

(56) References Cited

U.S. PATENT DOCUMENTS

| 6,563,714 B2 * | 5/2003 | Chang | 361/752 |
| 6,888,727 B2 * | 5/2005 | Chang | 361/752 |
| 2007/0025014 A1 * | 2/2007 | Kim | 360/97.01 |

FOREIGN PATENT DOCUMENTS

| TW | 474442 | 7/1987 |
| TW | M264618 | 9/1993 |

* cited by examiner

*Primary Examiner*—Hung Van Duong
(74) *Attorney, Agent, or Firm*—Peter F. Corless; Steven M. Jensen; Edwards Angell Palmer & Dodge LLP

(57) ABSTRACT

An anti-shock structure for a data storage device is proposed. The anti-shock structure mountable to an enclosure of an electronic device can protect a data storage device received in the anti-shock structure against shock coming from the enclosure of the electronic device. The anti-shock structure includes a base having a first positioning portion and at least a first position limit portion disposed thereon, and a circuit board having a second positioning portion and a second position limit portion. The data storage device is received in the base and electrically connected to the electronic device through the circuit board. The circuit board is movably mounted to the base with its second positioning portion being movably matched to the first positioning portion of the base for positioning the circuit board and its second position limit portion being engaged with the first position limit portion for preventing the circuit board from detaching from the base. Thereby, shock coming from the enclosure is absorbed by the circuit board instead of being transmitted to the data storage device received by the base. Thus, the data storage device is protected.

10 Claims, 6 Drawing Sheets

ANTI-SHOCK STRUCTURE FOR DATA STORAGE DEVICE

BACKGROUND OF THE INVENTION

1. Field of the Invention

The present invention relates to an anti-shock structure for a data storage device, and more particularly to an anti-shock structure for a data storage device used in an electronic device.

2. Description of Related Art

In general, for a hard disk drive disposed inside an enclosure of a computer, when the enclosure is subjected to vibration, the hard disk drive without a good anti-shock protection structure is easy to be vibrated and accordingly easy to be damaged. Thus, Taiwan Patent No. 00474442 discloses an external type hard disk drive case having anti-shock and anti-dust functions, as shown in FIG. 1. The hard disk drive case mainly includes a cover A, a hard disk drive B and a base C. A connecting port C1 and a power port C3 are disposed on the base C and connected to the hard disk drive B through a flexible circuit board C2 and a power line C4, respectively. The improvement is that the hard disk drive case further comprises a plurality of flexible pads 2' including an upper pad 21', a frame pad 22' defining an opening 221' and a lower pad 23'. The upper pad 21' is disposed between the cover A and the hard disk drive B. The opening 221' of the frame pad 22' can receive the fixing block 1', wherein the fixing block 1' is located around the hard disk drive B and fixed to the hard disk drive B by screws. Thus, the hard disk drive B and the fixing block 1' are surrounded by the frame pad 22'. The lower pad 23' is disposed between the hard disk B and the base C. By wrapping the hard disk disposed between the cover A and the base C with the pads 2', an external type hard disk drive case having anti-shock and anti-dust functions is obtained.

FIG. 2 is an exploded view of an anti-shock structure for a small type external hard disk drive case disclosed by Taiwan Patent No. M264618. As shown in FIG. 2, the anti-shock structure includes a plate 41' extending from and integrally formed with a circuit board 4'. The plate 41' allows a hard disk drive 6' to be fixed thereto. The circuit board 4' is used to electrically connect the hard disk drive 6' to an external case 3'. The anti-shock structure further includes a base plate 5' which can be received by the external case 3'. By stamping the base plate 5', a substantially U-shaped structure 51' is formed. Meanwhile, two flanges 52' extend outwardly from respective opposite side walls of the U-shape structure 51'. A plurality of fixing holes 53' is formed on each of the flanges 52' and two buffer strips 54' made of flexible material are respectively fixed to the flanges 52'. To assemble the base plate 5', the circuit board 4' and the hard disk 6' together, screws are passed through the fixing holes 53' of the base plate 5' and through holes of the circuit board 4' and fixed into screw holes of the hard disk drive 6'. Thus, a stack structure is formed, wherein the hard disk drive 6' is located on the circuit board 4' and the circuit board 4' is located on the base plate 5'. Such a structure is then mounted inside the external case 3' with the circuit board 4' electrically connecting the hard disk drive 6' and the external case 3'. Therein, the U-shaped structure 51' and the buffer strips 54' of the base plate 5' located below the circuit board 4' are helpful to protect the hard disk drive 6' located on the circuit board 4' against shock coming from the external case.

However, neither the flexible pads 2' nor the U-shaped structure 51' can completely protect the hard disk drive from being damaged by shock.

Accordingly, there is a need to develop an anti-shock structure which can improve the anti-shock efficiency and prolong the lifetime of a data storage device such as a hard disk drive.

SUMMARY OF THE INVENTION

According to the above defects, an objective of the present invention is to provide an anti-shock structure for a data storage device, which can prevent shock from being transmitted to the data storage device.

Another objective of the present invention is to provide an anti-shock structure for a data storage device, which has a simple configuration.

To achieve the above and other objectives, the present invention proposes an anti-shock structure applicable to a data storage device. The anti-shock structure can be mounted inside an enclosure of an electronic device so as to protect the data storage device in the anti-shock structure from shock coming from the enclosure of the electronic device. The anti-shock structure of the present invention comprises: a base for receiving a data storage device, which has a first positioning portion and at least a first position limit portion disposed thereon; and a circuit board for electrically connecting the data storage device to the electronic device, wherein the circuit board comprises a second positioning portion and a second position limit portion, the circuit board being mounted to the base with its second positioning portion being movably matched to the first positioning portion of the base for positioning the circuit board and its second position limit portion being engaged with the first position limit portion so as to prevent the circuit board from detaching from the base.

Preferably, the first positioning portion has a structure of a column, a block, a rib or the like. The second positioning portion can be such as an opening having a first recessed opening and a second recessed opening. Alternatively, the first positioning portion can be a slot and the second positioning portion has a structure of a column, a block, a rib or the like. Preferably, the first position limit portion is a column, a block, a rib or the like and the second position limit portion is a slot. Alternatively, the first position limit portion can be a slot and the second position limit portion can be a column, a block, a rib or the like. Preferably, the first position limit portion further comprises a first protruding portion, a second protruding portion and an end portion. The second position limit portion further comprises a first slot portion, a second slot portion, a third slot portion and a front slot portion. The data storage device can be such as a hard disk drive and the electronic device can be a server.

To mount the circuit board to the base, the third slot portion of the second position limit portion is aligned with the end portion of the first position limit portion and the first recessed opening of the second positioning portion is aligned with the first positioning portion, such that the first position limit portion and the first positioning portion can be loosely received in the second position limit portion and the second positioning portion, respectively.

Subsequently, the circuit board is moved toward a first direction such that the end portion of the first position limit of the base can be tightly fixed by the second slot portion of the second position limit portion of the circuit board, and the first protruding portion and the second protruding portion of the first position limit portion of the base can be tightly fixed by the front slot portion of the second position limit portion of the circuit board, and the first positioning portion of the base can be tightly fixed by the second recessed opening of the second positioning portion of the circuit board, thereby establishing a tight fit state between the circuit board and the base. Such an operation is very simple.

Then, both the base and the circuit board are moved toward a second direction such that the connecting socket of the circuit board can be automatically aligned and coupled with the connecting plug on a back plate of an enclosure of an electronic device. During the coupling process, as the maximum static friction force generated between the circuit board and the base is bigger than that generated between the connecting socket and the connecting plug, the circuit board can be kept at the original position without being moved, thereby facilitating the coupling operation. After the connecting socket is coupled to the connecting plug, the base is moved toward the second direction by exerting a little force thereon. As the resistance force generated from the coupling between the connecting socket and the connecting plug is bigger than the maximum static friction force between the circuit board and the base, the first positioning portion is moved toward the first recessed opening. Thus, a loose fit state is established again between the circuit board and the base. If a vibration force is transmitted from the enclosure to the circuit board through the back plate, since the circuit board and the base are kept in a loose fit state, the vibration force can not be further transmitted to the base. Instead, the vibration force causes the circuit board to vibrate and accordingly, the vibration force is absorbed by the circuit board. Therefore, compared with the prior art that only can partially protect the hard disk through a material or a structure design, the present invention provides complete protection for a data storage device against the shock or vibration.

DETAILED DESCRIPTION OF PREFERRED EMBODIMENTS

Hereunder, embodiments of the present invention will be described in full detail with reference to the accompanying drawings.

Figure 1:
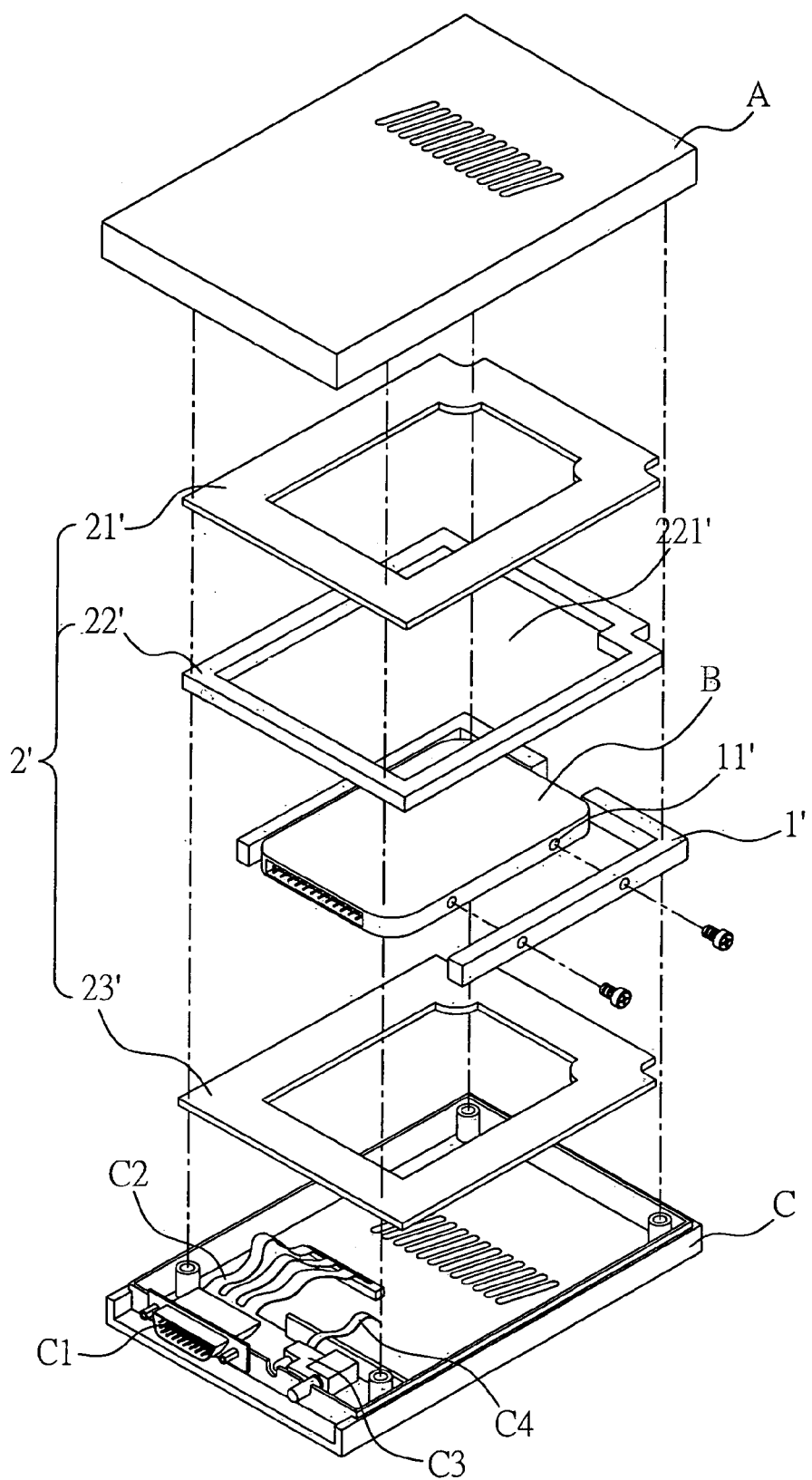
FIG. 1 is an exploded view of an external type hard disk drive case having anti-shock and anti-dust functions according to Taiwan Patent No. 00474442.
Figure 2:
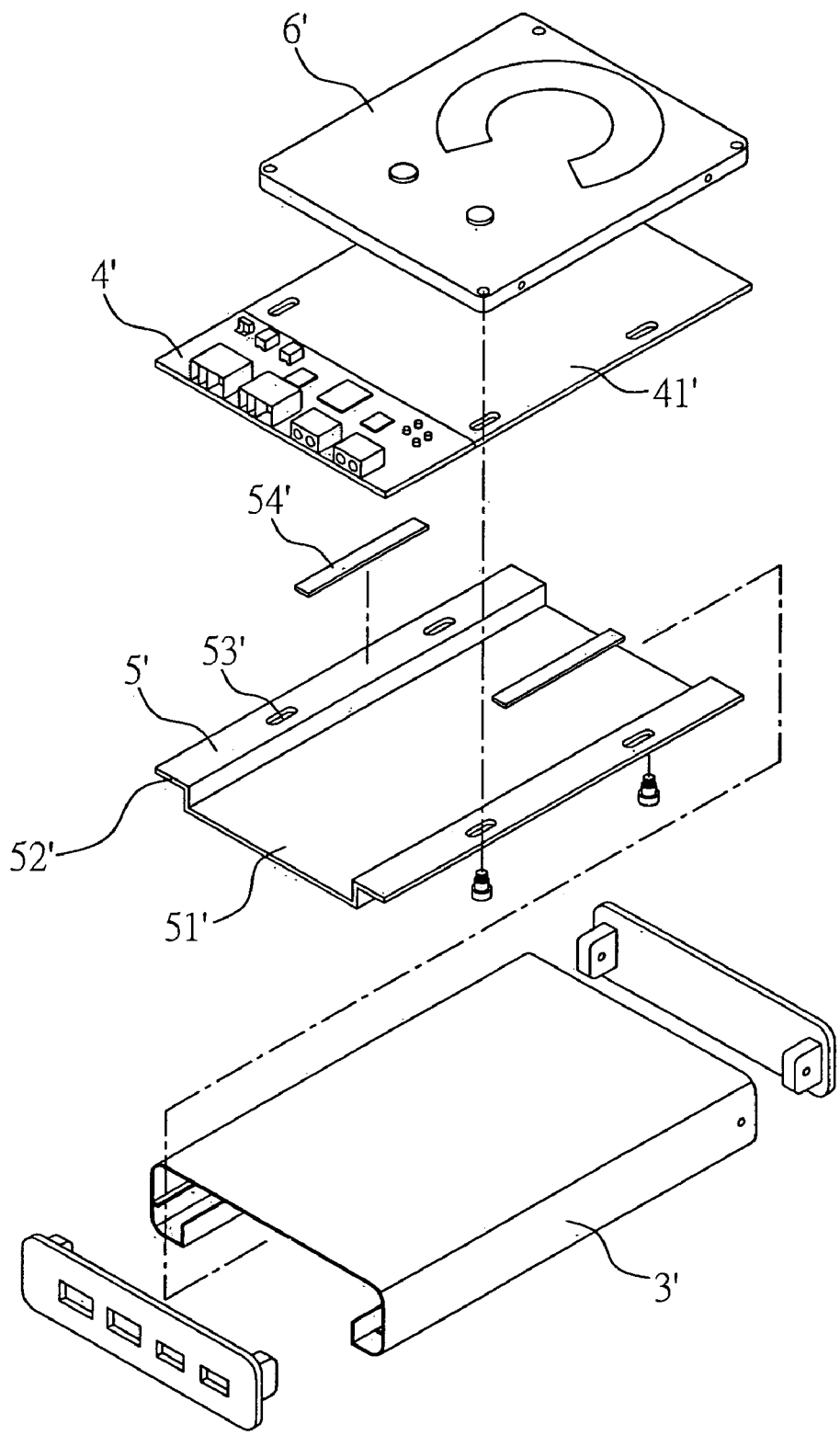
FIG. 2 is an exploded view of an anti-shock structure for a small type external hard disk drive case according to Taiwan Patent No. M264618.
Figure 3:
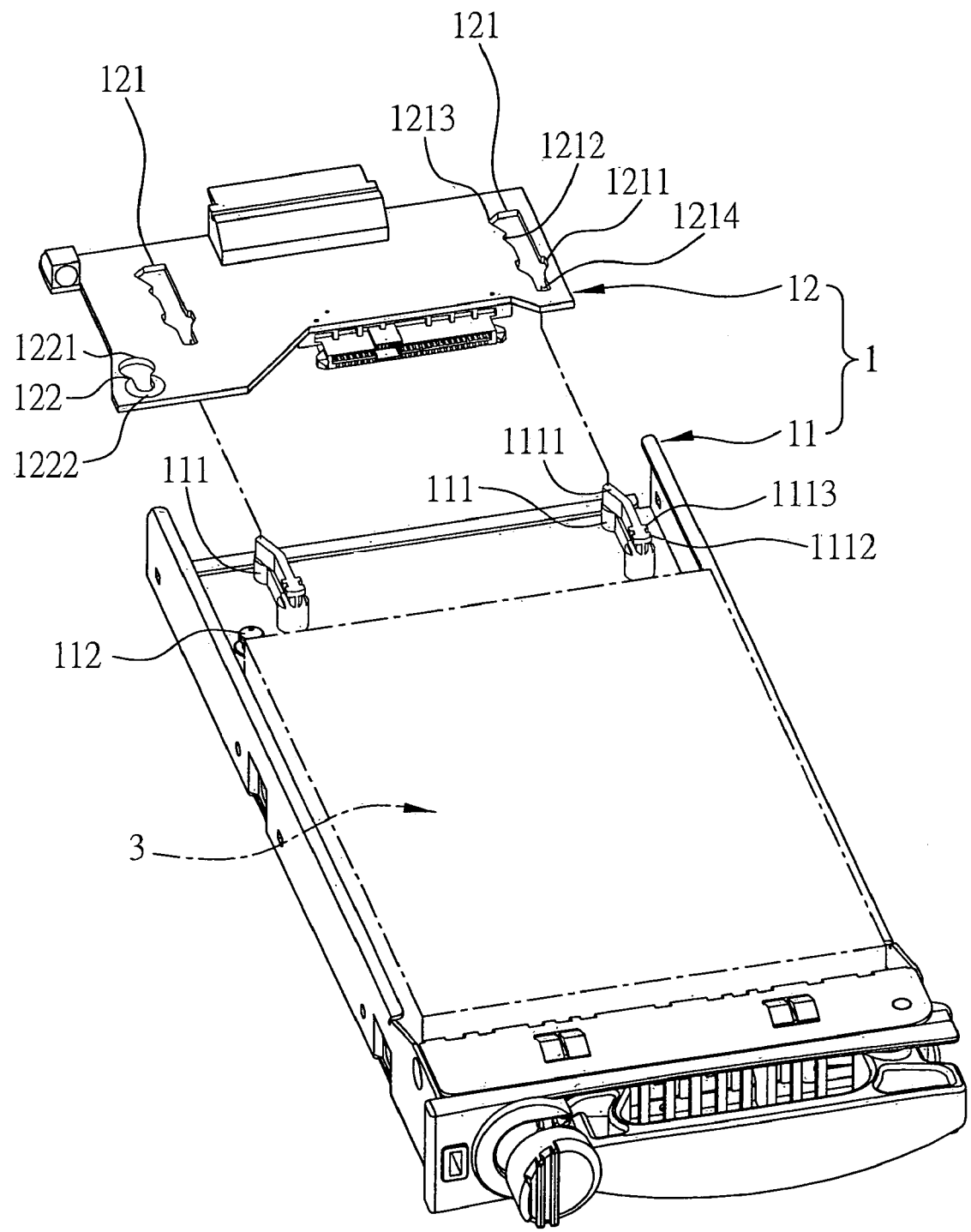
FIG. 3 is a partially exploded view of an anti-shock structure for a data storage device according to the present invention.

FIG. 3 shows an anti-shock structure 1 for a data storage device 3 according to the present invention. The anti-shock structure 1 comprises a base 11 and a circuit board 12 mountable to the base 11. A data storage device 3 can be received by the base 11 of the anti-shock structure 1. The anti-shock structure 1 with the data storage device 3 received therein can be further received in an enclosure of an electronic device, wherein the data storage device 3 is electrically connected to the electronic device through the circuit board 12. The circuit board 12 of the anti-shock structure 1 can be kept in a loose fit state with the base 11 such that when the enclosure of the electronic device is subjected to shock or vibration, the circuit board 12 can absorb the shock or vibration, thereby protecting the data storage device 3 from the shock or vibration. In the present embodiment, the data storage device 3 is a hard disk drive and the electronic device is a server. Mounting structures of the base 11 and the circuit board 12 are detailed as follows.

As shown in FIG. 3, the base 11 of the anti-shock structure 1 comprises a first positioning portion 112 and at least a first position limit portion 111 disposed thereon. The first positioning portion 112 is in the shape of a column. But it is not limited thereto. Alternatively, the first positioning portion 112 can be in the shape of a block or a rib. The column-shaped first position limit portion 111 includes a first protruding portion 1112 located at one end of the first position limit portion 111 toward the data storage device received in the base 11, a second protruding portion 1113 located substantially in the middle of the first position limit portion 111 and an end portion 1111 located at the other end of the first position limit portion 111.

The circuit board 12 of the anti-shock structure 1 is provided with a second positioning portion 122 and a second position limit portion 121. The second positioning portion 122 of the circuit board 12 is movably matched with the first positioning portion 112 of the base 11 to position the circuit board 12. The second position limit portion 121 can be engaged with the first position limit portion 111 of the base 11 for preventing the circuit board 12 from detaching from the base 11. The second positioning portion 122 is an opening having a first recessed opening 1221 and a second recessed opening 1222. The second position limit portion 121 can be, for example, a slot having a first slot portion 1211, a second slot portion 1212, a third slot portion 1213 and a front slot portion 1214.

The first recessed opening 1221 is used to loosely receive the first positioning portion 112 of the base 11 and thus keep the circuit board 12 in a loose fit state with the base 11. The second recessed opening 1222 is used to tightly fix the first positioning portion 112 of the base 11 and thus keep the circuit board 12 in a tight fit state with the base 11. The first slot portion 1211 allows the first protruding portion 1112 and the second protruding portion 1113 to be loosely received therein. The front slot portion 1214 is used to tightly fix the first protruding portion 1112 and the second protruding portion 1113. The second slot portion 1212 is used to tightly fix the end portion 1111 of the first position limit portion 111. The third slot portion 1213 is used to loosely receive the end portion 1111 of the first position limit portion 1111.

Figure 4:
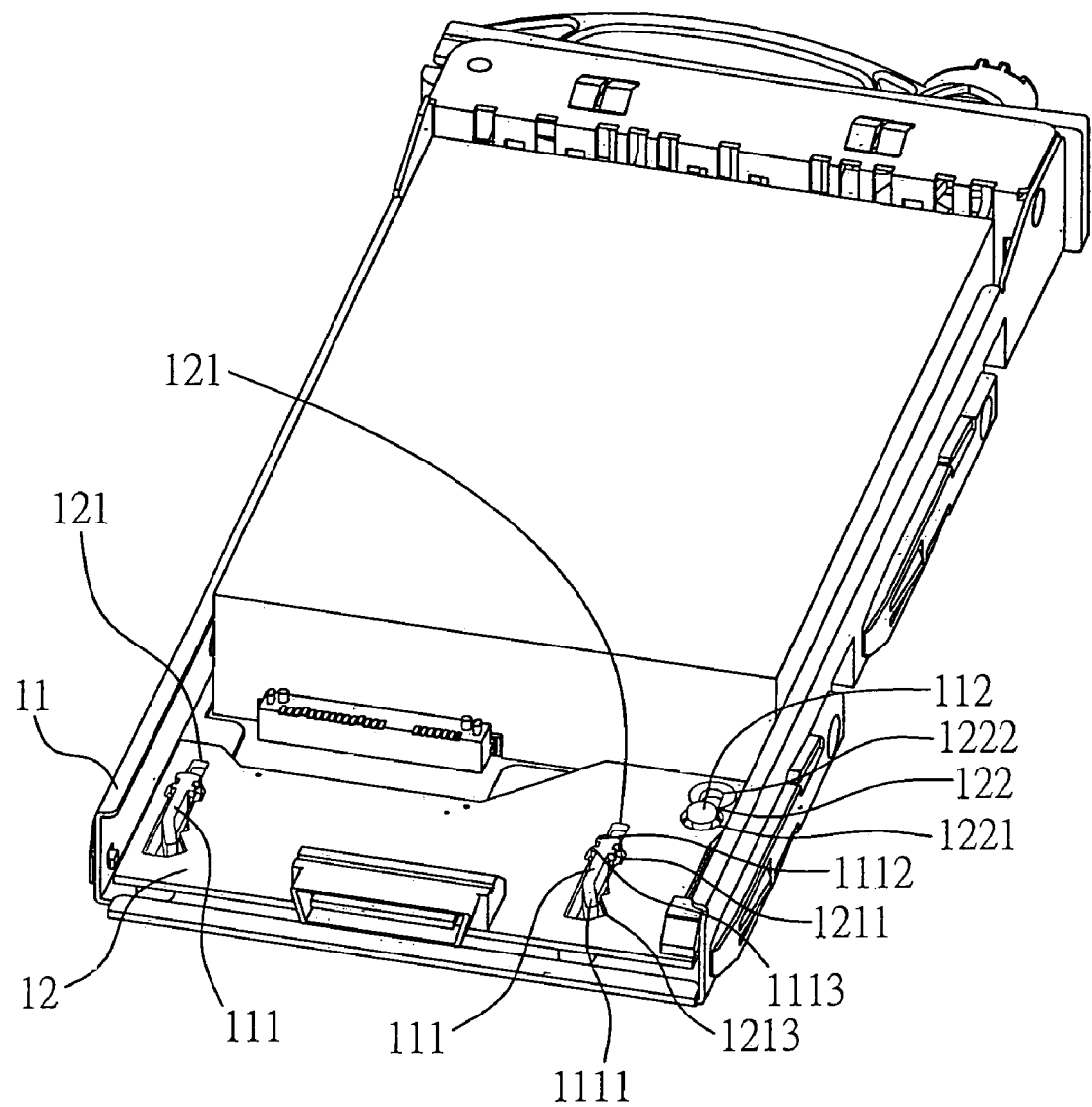
FIG. 4 shows an anti-shock structure with its circuit board and base being in a loose fit state according to the present invention.

FIG. 4 shows an assembly diagram of the anti-shock structure 1. To mount the circuit board 12 to the base 11, the third slot portion 1213 of the second position limit portion 121 is aligned with the end portion 1111 of the first position limit portion 111 and the first recessed opening 1221 of the second positioning portion 122 is aligned with the first positioning portion 112, such that the first position limit portion 111 and the first positioning portion 112 can be respectively loosely received in the second position limit portion 121 and the second positioning portion 122, thereby establishing a loose fit state between the circuit board 12 and the base 11. That is, the circuit board 12 mounted to the base 11 is shakable.

Figure 5:
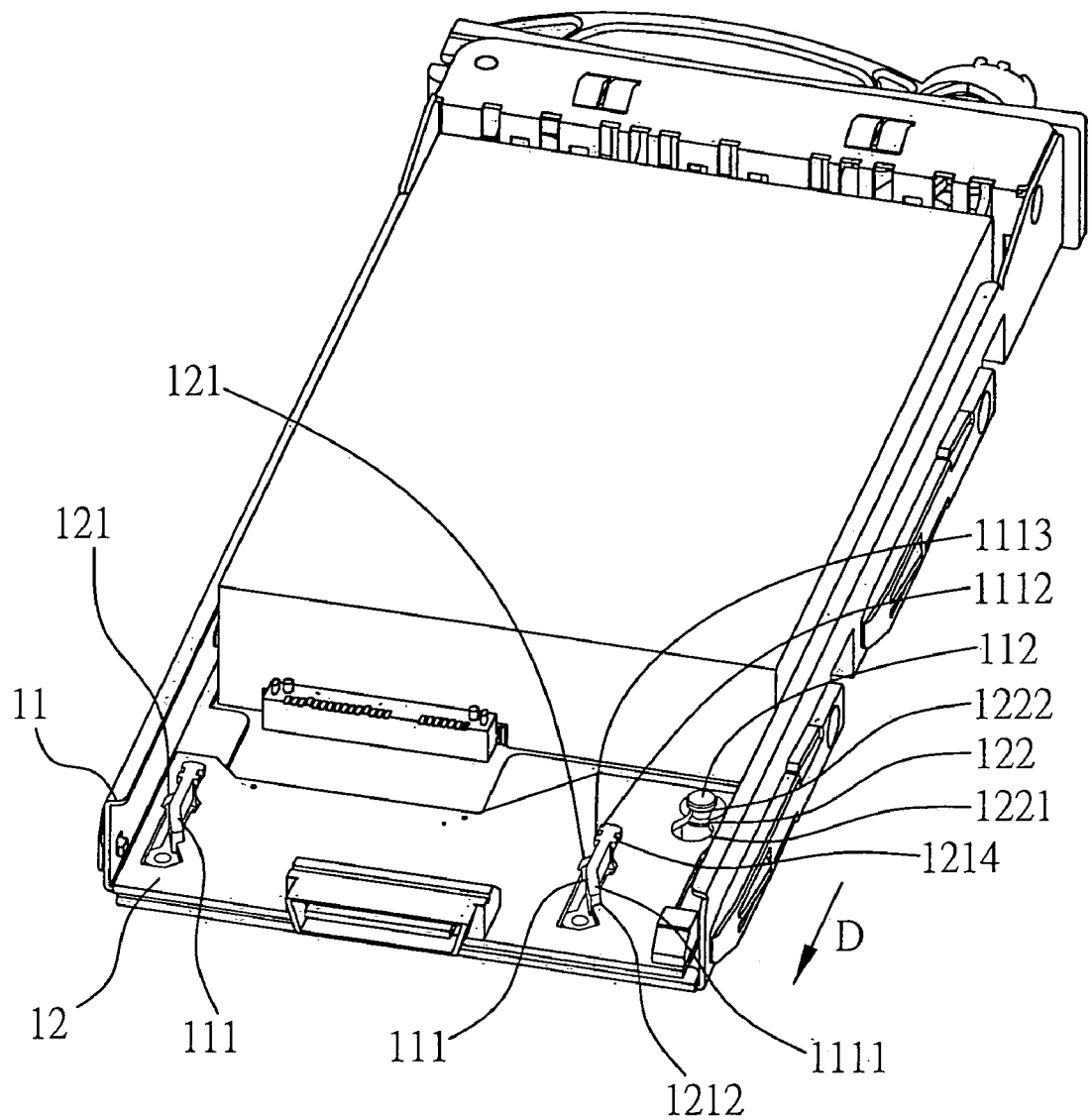
FIG. 5 shows an anti-shock structure with its circuit board and base being in a tight fit state according to the present invention.

Subsequently, the circuit board 12 is moved toward the direction of D as shown in FIG. 5. Thus, the end portion 1111 of the first position limit 111 of the base 11 is tightly fixed by the second slot portion 1212 of the second position limit portion 121 of the circuit board 12, and the first protruding portion 1112 and the second protruding portion 1113 of the first position limit portion 111 of the base 11 are tightly fixed by the front slot portion 1214 of the second position limit portion 121 of the circuit board 12, and the first positioning portion 112 of the base 11 is tightly fixed by the second recessed opening 1222 of the second positioning portion 122 of the circuit board 12, thereby establishing a tight fit state between the circuit board 12 and the base 11.

Figure 6:
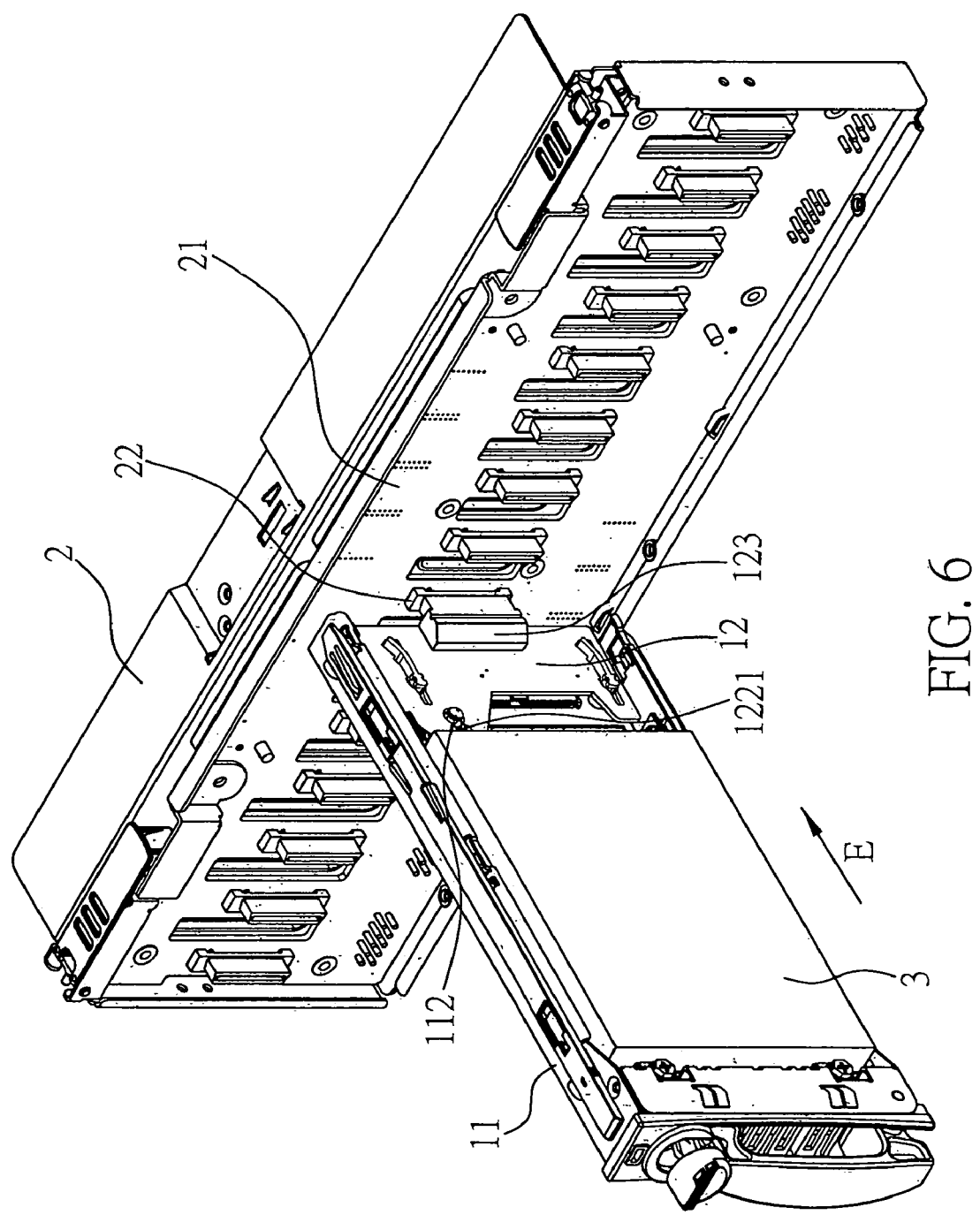
FIG. 6 is an assembly view of an anti-shock structure and a back plate of an electronic device according to the present invention.

Referring to FIG. 6, the anti-shock structure 1 with the data storage device 3 received therein is mounted to a back plate 21 of an enclosure 2 of an electronic device such as a server. In the mounting process, both the base 11 and the circuit board 12 are moved toward the direction of E such that the connecting socket 123 of the circuit board 12 can be automatically aligned and coupled with the connecting plug 22 on the back plate 21. As the maximum static friction force generated between the circuit board 12 and the base 11 is bigger than that generated between the connecting socket 123 and the connecting plug 22, the circuit board 12 can be kept at the original position without being moved, thereby facilitating the coupling operation. After the connecting socket 123 is coupled to the connecting plug 22, the base 11 is moved toward the direction of E by exerting a little force thereon. As the resistance force generated from the coupling between the connecting socket 123 and the connecting plug 22 is bigger than the maximum static friction force between the circuit board 12 and the base 11, the first positioning portion 112 is moved toward the first recessed opening 1221. Thus, a loose fit state is established again between the circuit board 12 and the base 11. If a vibration force is transmitted from the enclosure 2 to the circuit board 12 through the back plate 21, since the circuit board 12 and the base 11 are in a loose fit state, the vibration force can not be further transmitted to the base 11. Instead, the vibration force causes the circuit board 12 to vibrate and accordingly, the vibration force is absorbed by the circuit board 12. Therefore, the data storage device received by the base is completely protected from the shock or vibration.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An anti-shock structure mountable to an enclosure of an electronic device for protecting a data storage device received in the anti-shock structure against shock coming from the enclosure of the electronic device, the anti-shock structure comprising:

a base for receiving a data storage device, which has a first positioning portion and at least a first position limit portion disposed thereon; and a circuit board for electrically connecting the data storage device to the electronic device, wherein the circuit board comprises a second positioning portion and a second position limit portion, the circuit board being mounted to the base with its second positioning portion being movably matched to the first positioning portion of the base for positioning the circuit board and its second position limit portion being engaged with the first position limit portion so as to prevent the circuit board from detaching from the base.

2. The anti-shock structure of claim 1, wherein the first positioning portion is one of a column, a block and a rib.

3. The anti-shock structure of claim 2, wherein the second positioning portion is an opening.

4. The anti-shock structure of claim 3, wherein the opening has a first recessed opening and a second recessed opening.

5. The anti-shock structure of claim 1, wherein the first position limit portion is one of a column, a block and a rib and the second position limit portion is a slot.

6. The anti-shock structure of claim 5, wherein the slot comprises a first slot portion, a second slot portion, a third slot portion and a front slot portion.

7. The anti-shock structure of claim 5, wherein the first position limit portion comprises a first protruding portion, a second protruding portion and an end portion.

8. The anti-shock structure of claim 1, wherein the first positioning portion is a slot and the second positioning portion is one of a column, a block and a rib.

9. The anti-shock structure of claim 1, wherein the first position limit portion is a slot and the second position limit portion is one of a column, a block and a rib.

10. The anti-shock structure of claim 1, wherein the data storage device is a hard disk drive and the electronic device is a server.

* * * * *